United States Patent
Yamazoe et al.

(10) Patent No.: US 7,215,179 B2
(45) Date of Patent: May 8, 2007

(54) BOOSTER CIRCUIT

(75) Inventors: Takanori Yamazoe, Hadano (JP); Takeo Kanai, Kodaira (JP)

(73) Assignee: Renesas Technology Corp., Tokyo (JP)

( * ) Notice: Subject to any disclaimer, the term of this patent is extended or adjusted under 35 U.S.C. 154(b) by 53 days.

(21) Appl. No.: 10/535,102

(22) PCT Filed: Sep. 26, 2003

(86) PCT No.: PCT/JP03/12336

§ 371 (c)(1), (2), (4) Date: May 16, 2005

(87) PCT Pub. No.: WO2004/047274

PCT Pub. Date: Jun. 3, 2004

(65) Prior Publication Data
US 2006/0006925 A1    Jan. 12, 2006

(30) Foreign Application Priority Data
Nov. 18, 2002    (JP) .............................. 2002-333033

(51) Int. Cl.
G05F 1/10    (2006.01)

(52) U.S. Cl. ...................................... 327/537; 327/534

(58) Field of Classification Search .................... None
See application file for complete search history.

(56) References Cited

U.S. PATENT DOCUMENTS

| | | | | |
|---|---|---|---|---|
| 6,603,346 B2 * | 8/2003 | Sawada et al. | ............. | 327/536 |
| 6,661,682 B2 * | 12/2003 | Kim et al. | ..................... | 363/59 |
| 6,747,897 B2 | 6/2004 | Karaki | | |
| 6,819,162 B2 * | 11/2004 | Pelliconi | ..................... | 327/536 |

FOREIGN PATENT DOCUMENTS
JP     11-308856     11/1999

OTHER PUBLICATIONS
"A Dynamic Analysis of a Dicson Charge Pump", IEEE, Journal of Solid-State Circuits, vol. 32, No. 8 Aug. 1997 (cited in the specification).

* cited by examiner

Primary Examiner—My-Trang Nu Ton
Assistant Examiner—Cassandra Cox
(74) Attorney, Agent, or Firm—Antonelli, Terry, Stout & Kraus, LLP.

(57) ABSTRACT

The present invention relates to a booster circuit of a non-volatile memory requiring a plus or minus high voltage equal to or higher than a power-supply voltage. The present invention can generate a high voltage of approximately 12 V even at a low power-supply voltage equal to or lower than 3 V and generate not only a plus high voltage but also a minus high voltage by the same circuit. Also, by combining a body-controlled type parallel charge pump, which is a booster circuit according to the present invention, with a serial-type charge pump, two types of high voltages can be efficiently generated and a reduction in chip areas can be achieved.

19 Claims, 16 Drawing Sheets

BOOSTER CIRCUIT

This application is a 371 of PCT/JP03/12336 filed on Sep. 26, 2003.

TECHNICAL FILED OF THE INVENTION

The present invention relates to a semiconductor charge pump circuit for generating a voltage higher than an operating voltage or generating a negative voltage, and to a semiconductor integrated circuit using the same.

BACKGROUND OF THE INVENTION

When a non-volatile memory such as a Flash or EEPROM is deleted or written, a tunnel effect, hot electron, or hot hole is used, so that a high voltage of approximately 12 V is required. As a conventional charge-pump type booster circuit which generates a high voltage, a Dicson charge pump diode-connected to a MOS transistor (hereinafter, "transfer MOS") moving electric charges has been generally known and often used because a circuit configuration thereof is very simple. Such a Dicson charge pump is presented and analyzed in "A Dynamic Analysis of the Dicson Charge Pump", IEEE, JOURNAL OF SOLID-STATE CIRCUITS, VOL. 32, No. 8, Aug. 1997. FIGS. 1 and 2 show structural diagrams of the Dicson charge pump. FIG. 1 is a conceptual block diagram disclosed also in the above IEEE document, and FIG. 2 is an example in which buffers in FIG. 1 are replaced by n-type MOSS. In FIG. 2, a drain and gate of the n-type MOS are short-circuited, and a CLK is applied to one side of a capacitance connected to the drain and source. The CLK and a CLKn have a complementary relation, as shown in FIG. 3. When the CLKn is "High" and the CLK is "Low", drain potentials at odd-th stages such as first and third stages are higher than a source potential. Therefore, a drain current flows through the n-type MOSs at the odd-numbered stages, whereby electric charges are charged in odd-th capacitances C1 and C3. Conversely, when the CLK is "High" and the CLKn is "Low", the drain potentials at even-th stages such as second and fourth stages are higher than the source potential. Therefore, a drain current flows through the n-type MOSs at the even-th stages, whereby electric charges are charged move from the odd-th capacitances C1 and C3 to even-th capacitances C2 and C4.

If it is assumed that each threshold voltage of n-type MOS transistors configuring the Dicson charge pump is Vt, an output voltage Vout thereof can be represented by:

$$V\text{out} = (Vcc - Vt) \times N + Vcc \quad (1)$$

N: number of stages and Vcc: power-supply voltage.

However, as approaching an output side, the drain and source voltages of the n-MOS transistor are boosted and, by an substrate effect caused due to an increase in a source-substrate voltage Vsb, a threshold voltage Vt of an NMOS transistor is increased as shown in the following Equation (2):

$$Vt = Vt0 + \gamma(\sqrt{2\phi f + Vsb} - \sqrt{2\phi f}) \quad (2)$$

Vt0: Vt at Vsb=0 V, γ: substrate effect coefficient, and φf: Fermi level of substrate.

Furthermore, since the Vsb at Vt=Vcc means the maximum voltage of boosted voltages obtained from the equation (2), $$V\text{out\_max}(=Vsb) = \left(\frac{Vcc - Vt0}{\gamma} + \sqrt{2\phi f}\right)^2 - 2\phi f \quad (3)$$

and therefore the maximum boosted voltage Vout_max can be calculated from the formula (3). FIG. 4 shows calculation values of the power-supply voltage Vcc and the boosted voltage Vout. As seen from FIG. 4, it is understood that in the Dicson charge pump, the boosted voltage Vout_max is determined depending on the power-supply voltage Vcc.

An improved version of Dicson charge pump has also been studied. In a "charge pump circuit device" disclosed in Japanese Patent Laid-Open No. 11-308856, the n-type MOSs are separated into a plurality of groups to suppress an increase in the Vt of the n-type MOS due to the substrate effect caused by increasing gradually the substrate voltage.

As the above-described Dicson charge pump that is a conventional technique is boosted, the source-substrate voltage Vsb of the n-type MOS is increased and thereby the threshold voltage Vt of the n-type MOS is increased due to an influence of the substrate effect, so that the maximum value of the boosted voltage is determined. As a result, by a low power-supply voltage equal to or lower than 3 V, a high voltage of approximately 12 V required for deleting or writing the non-volatile memory cannot be generated.

Moreover, even when the "charge pump circuit device", which is disclosed in Japanese Patent Laid-Open No. 11-308856 and in which the n-type MOSs are separated into the plurality of groups to suppress an influence of the substrate effect caused by increasing gradually the substrate voltage, is used, there are the n-type MOSs not meeting Vsb=0 V, so that it is impossible to eliminate the substrate effects of all the n-type MOSs.

Also, "Semiconductor charge pump circuit and non-volatile semiconductor storage device" in Japanese Patent Laid-Open No. 2003-45193 discloses a scheme in which a charge voltage at a stage that precedes the immediately preceding stage is a substrate potential of the n-type MOS, wherein the different voltage values for each stage are set as the substrate potentials of the n-type MOS. However, the Vsb becomes a voltage-amplified value Vga (=Vcc−Vt) for at least one stage, so that the substrate effect is caused.

An object of the present invention is to provide a charge pump circuit having no influence of the substrate effects, and also to provide the charge pump circuit having an efficient circuit configuration and capable of generating a plus or minus high voltage.

DISCLOSURE OF THE INVENTION

In order to solve the above problems, a MOS which controls the substrate of the n-type MOS transferring electric charges is added. If there is the n-type MOS, the substrate potential is always set to a drain or source potential, whichever is lower in potential, to meet Vsb=0 V, whereby the influence of the substrate effect is eliminated.

When Vsb=0 V, the second term of the Equation (2) can be made 0, but the Vt0 in the first term is left. In order that this Vt0 of the n-type MOS is made 0 V, a voltage equal to or higher than (power-supply voltage+Vt0) is applied to a gate of the n-type MOS via a capacitance Cg and, at the same time, the gate voltage set in the n-type MOS is used to control a gate potential of an n-type MOS at the next stage, whereby charge-transfer efficiency is enhanced.

BEST MODE FOR CARRYING OUT THE INVENTION

Figure 1:
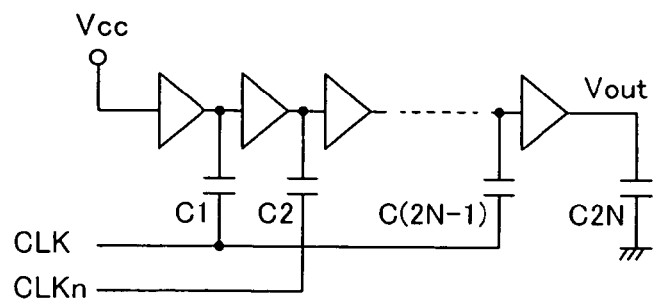
FIG. 1 is a structural diagram of a conventional Dicson charge pump.
Figure 2:
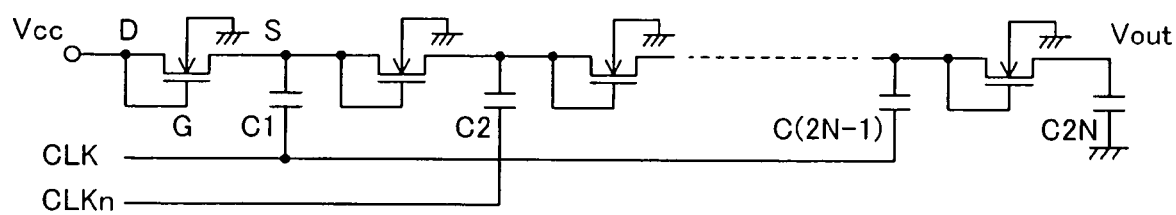
FIG. 2 is a circuit diagram of the conventional Dicson charge pump.
Figure 3:
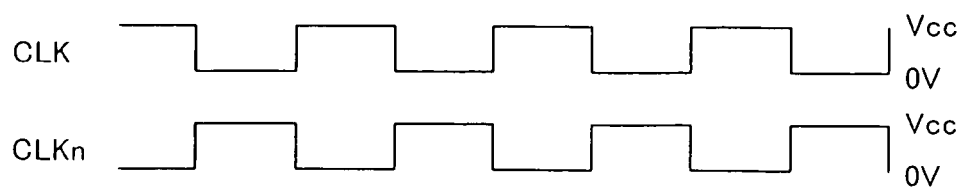
FIG. 3 is a chart showing clock waveforms.
Figure 4:
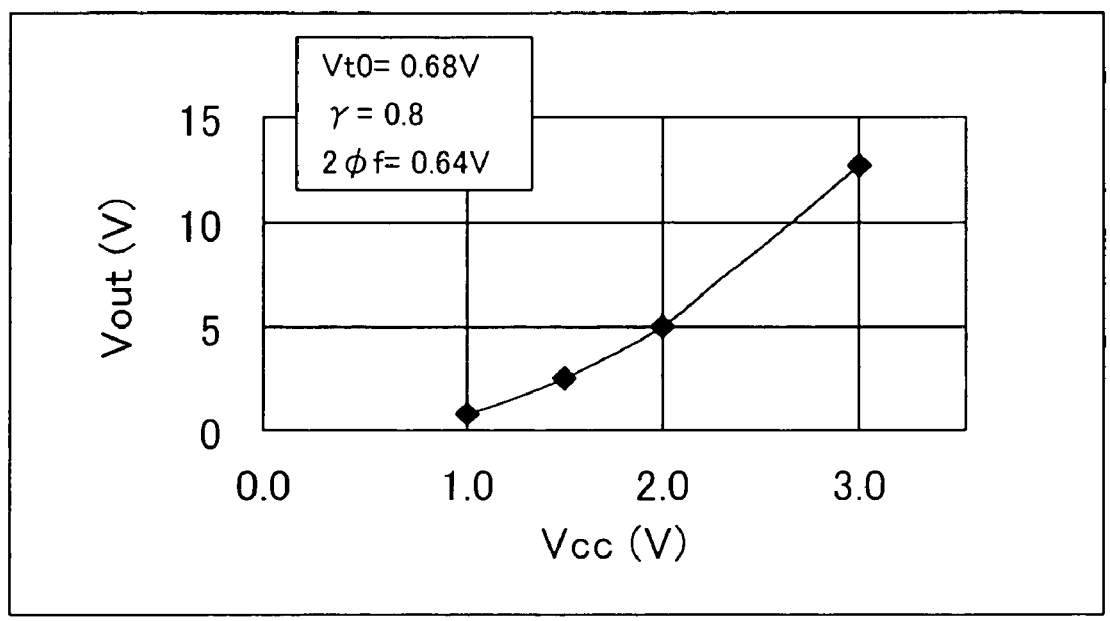
FIG. 4 is a graph indicative of boosted-voltage calculation values of the Dicson charge pump.

Hereinafter, embodiments of the present invention will be described according to the drawings. Although not being limited, circuit elements in the present invention are realized by a well-known Si semiconductor integrated circuit. In the drawings of the present application, a component whose back gate has an arrow directed inwardly represents an n-type MOSFET. Also, a component whose back gate has an arrow directed outwardly and whose gate is circled represents a p-type MOSFET.

In the specification, a MOSFET (Metal Oxide Semiconductor Field Effect Transistor) is abbreviated as a MOS. Note that the present invention can be generally applied to a MISFET.

Figure 5:
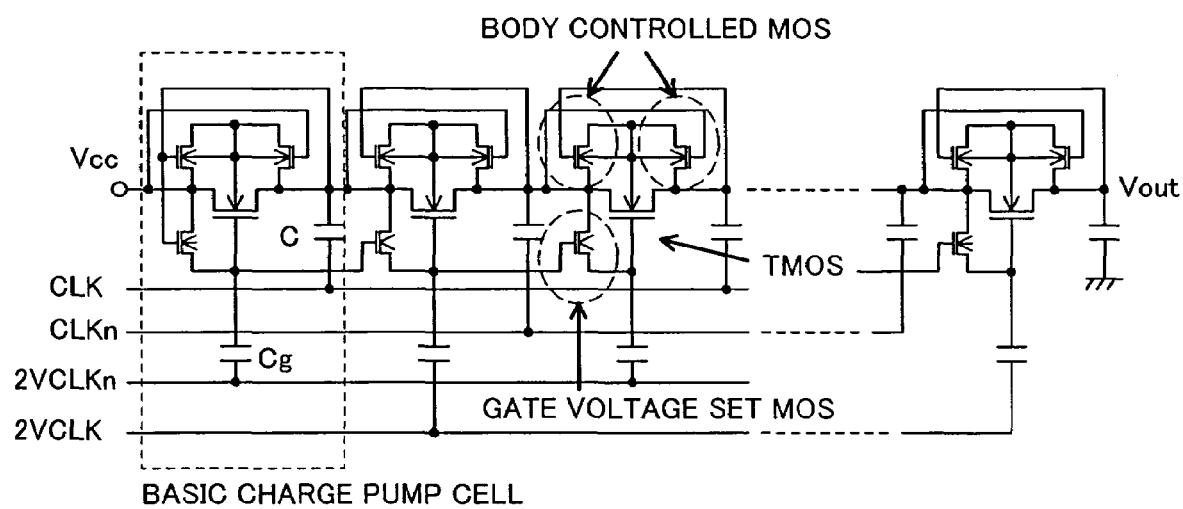
FIG. 5 is an entire circuit diagram of a charge pump circuit according to a first embodiment of the present invention.
Figure 6:
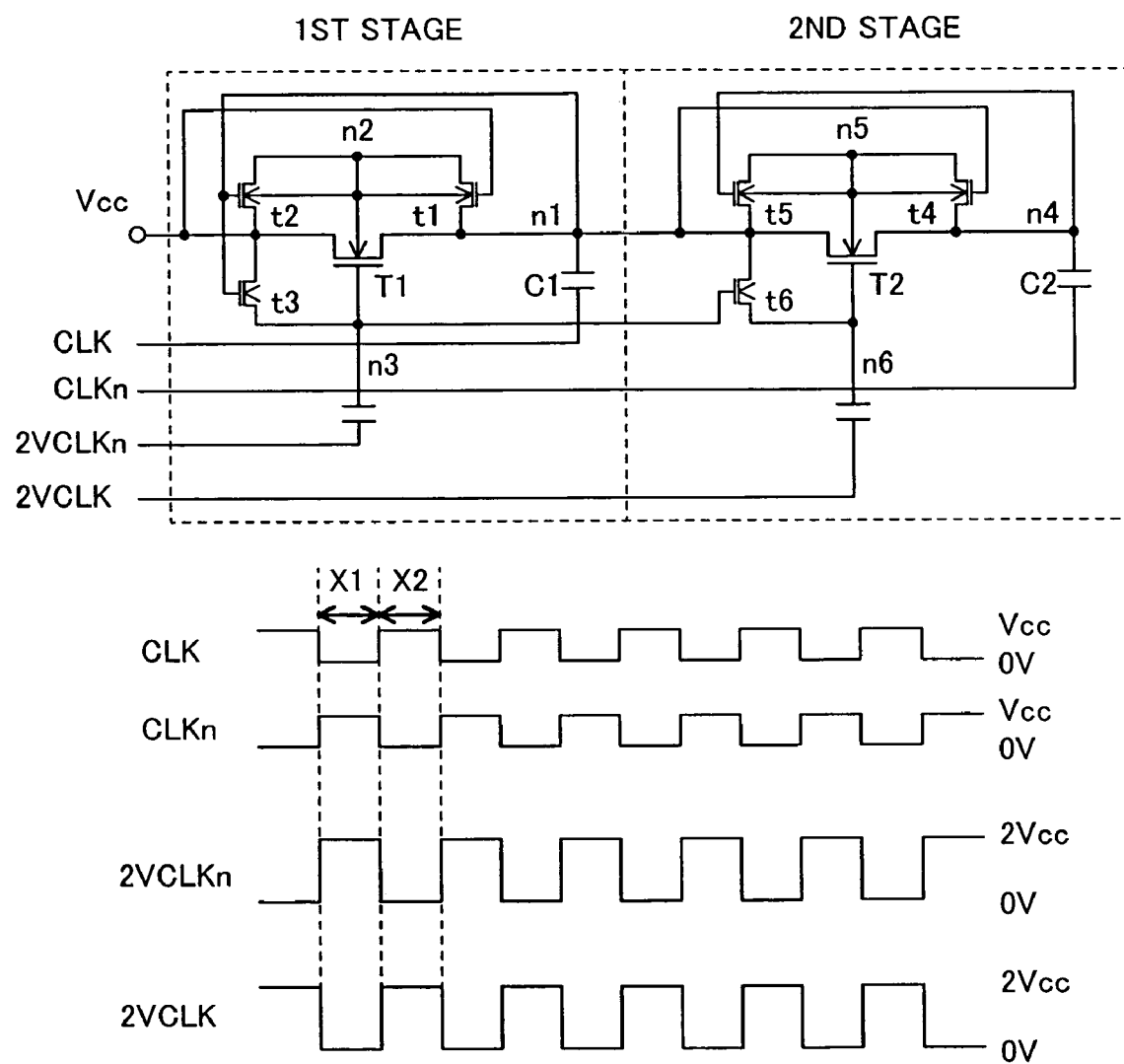
FIG. 6 is a partial circuit diagram of the charge pump circuit according to the first embodiment of the present invention.

An entire charge pump circuit generating a plus high voltage according to a first embodiment of the present invention is shown in FIG. 5 and a partial extraction from charge pump stages is shown in FIG. 6. The charge pump circuit according to the present invention is one in which basic pump cells each including four n-type MOSs and two capacitances are connected in series in a multistage manner. Each basic pump cell is composed of: a transfer MOS (TMOS) transferring electric charges to the next stage; body controlled MOSs each serving as a connection circuit for connecting a substrate (also referred to as well) of the TMOS to a drain or source of the transfer MOS; a gate voltage set MOS serving as a connection circuit for connecting a gate potential of the transfer MOS to the drain; a charge capacitance (C) for charging the electric charges transferred from the TMOS; and a transfer gate capacitance (Cg) for transferring a potential of 2VCLK or 2VCLKn to the gate of the TMOS. Also, the gate of the TMOS is connected to a gate of the gate voltage set MOS at the next stage. However, the gate of the gate voltage set MOS at the first stage is connected to a connection point between the TMOS and the charge capacitance. All of these transfer MOS, body controlled MOSs, and gate voltage set MOS are implemented by using nMOSs.

Two-phase clock signals CLK and CLKn have operating voltages Vcc as their amplitudes. Output timings of the clock signals CLK and CLKn are such that: the CLKn is at 0 V when the clock signal CLK is at the operating voltage Vcc; the CLKn is at the operating voltage Vcc when the clock signal CLK is at 0 V; and these clock signals have an opposite-phase relation to each other.

Also, two-phase clock signals 2VCLK and 2VCLKn have 2Vcc, which is twice as much as the operating voltage, as their amplitudes. Similarly to the CLK and CLKn, the 2VCLK and 2VCLKn are clock signals having an opposite-phase relation to each other.

The operations will be described below with reference to FIGS. 7 and 8.

Figure 7:
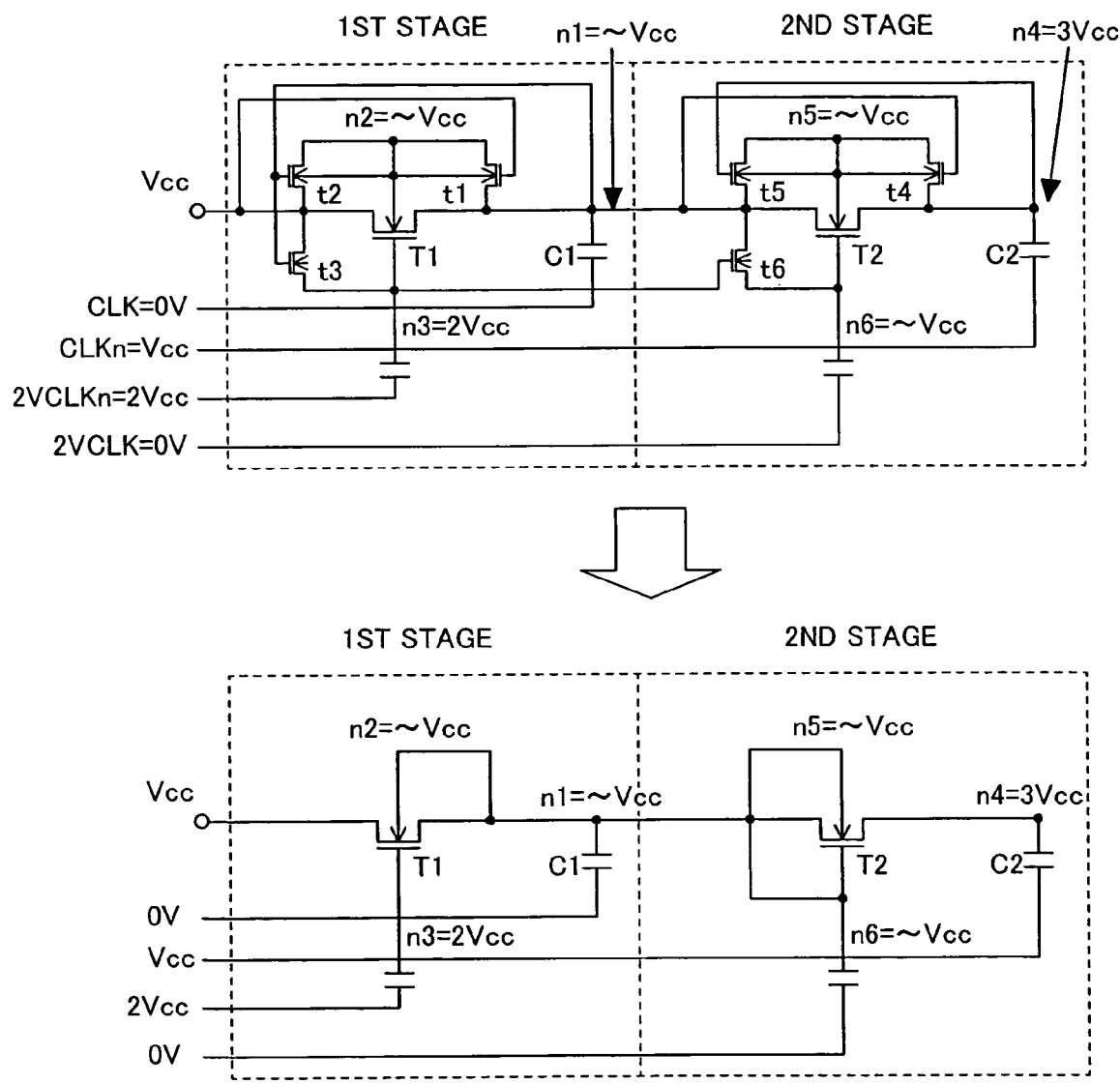
FIG. 7 is a circuit's explanatory diagram of the charge pump circuit according to the first embodiment of the present invention in a period of CLK X1.

In a period of CLK X1 shown in FIG. 7, since CLK=0 V and 2VCLKn=2Vcc, an n3 potential of a gate of the transfer MOS becomes equal to or higher than 2Vcc and a T1 is turned ON, so that the electric charges are supplied from the Vcc to a charge capacitance C1 and an n1 potential eventually becomes the Vcc. Therefore, since the n1 potential is equal to or lower than the Vcc while the charge capacitance C1 is being charged, the gate of the nMOS is coupled to the n1 potential and t2 and t3, whose each source or drain is equal to or higher than the Vcc, are turned OFF. Also, since the gate of the nMOS is connected to the Vcc, a t1 in which the n1 potential serving as a drain or source potential is equal to or lower than the Vcc is turned ON and a substrate potential n2 of the T1, which is a transfer MOS, becomes the n1 potential, thereby being coupled to the drain or source of the TMOS, whichever is lower in potential. Here, the Vt0 of the transfer MOS is generally lower than the Vcc and a n3, which is a gate potential of the transfer MOS, becomes equal to or higher than 2Vcc, so that the n1 potential increases to the Vcc without a loss of the Vt0.

At a second stage, since CLKn=Vcc and 2VCLK=0 V, an n4 potential becomes (Q2/C2)+Vcc if it is assumed that the electric charges stored in a charge capacitance C2 are Q2. Here, if it is assumed that all of the electric charges in the C1 have been transferred from the first stage, Vcc+(Q1/C1)= (Q2/C2)=2Vcc. Therefore, the n4 potential becomes the 3Vcc and since n4 potential>n1 potential, a t5 in which the gate of the nMOS is coupled to the n4 potential is turned ON and the t4 in which the gate of the nMOS is coupled to the n1 potential is turned OFF. Since the t5 is turned ON, a substrate potential n5 of a transfer nMOS T2 becomes the n1 potential. Also, a t6 in which the gate of the nMOS is coupled to the n3 potential is turned ON and an n6 potential that is a gate potential of the T2 becomes the n5 potential, whereby the T2 is turned OFF.

An odd-numbered (2N−1)-th stage (N is equal to or larger than 1) including third and later stages is such that, similarly to the first stage, the TMOS is turned ON and a connection point between the charge capacitance C(2N−1) and the TMOS is at Vcc×(2N−1). Also, an even-numbered 2N-th stage is such that the TMOS is turned OFF and a connection point between the charge capacitance C(2N) and the TMOS is at Vcc+Vcc×2N.

Figure 8:
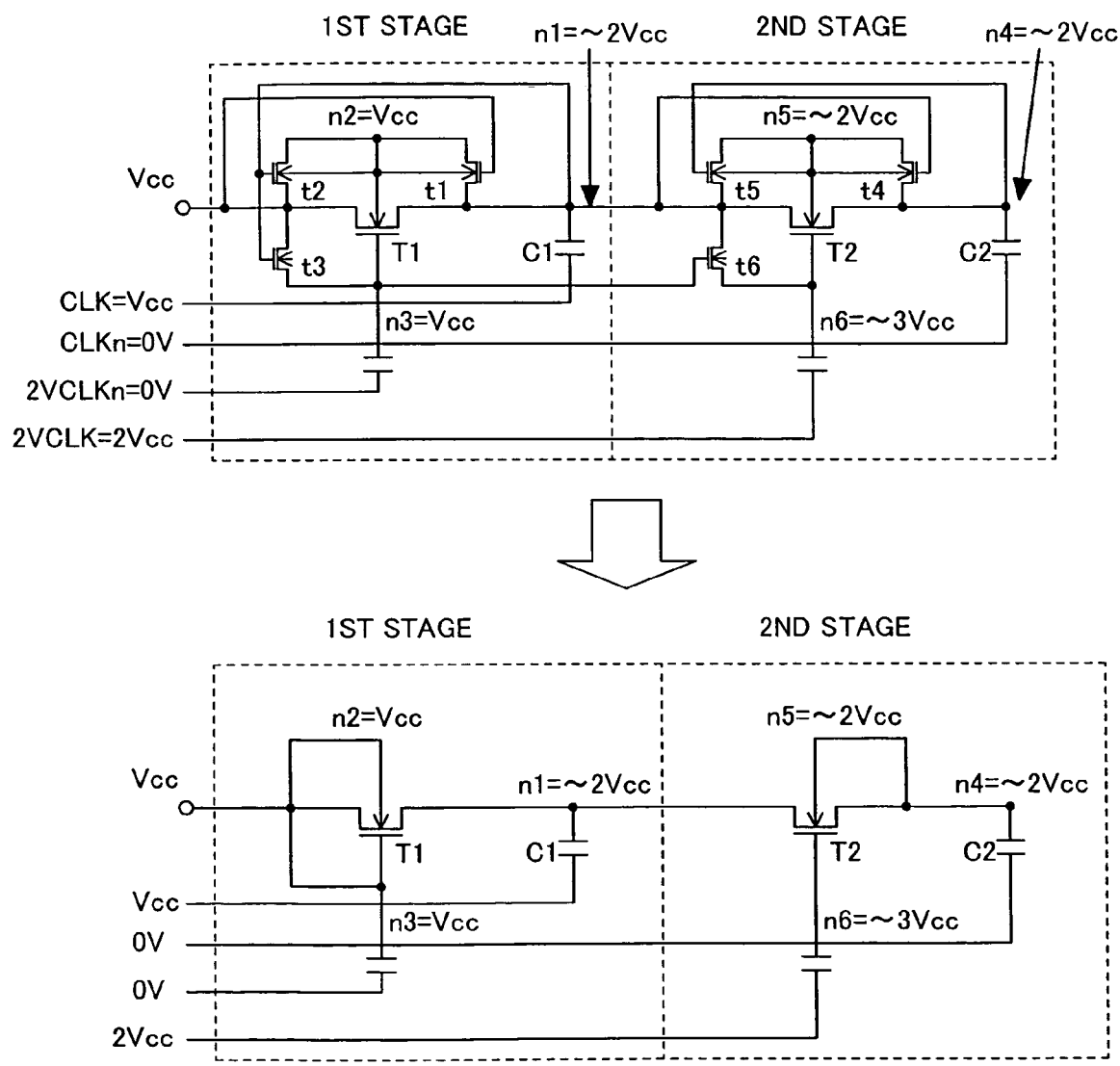
FIG. 8 is a circuit's explanatory diagram of the charge pump circuit according to the first embodiment of the present invention in a period of CLK X2.

In a period of CLK X2 shown in FIG. 8, since CLK=Vcc and 2VCLKn=0 V, the n1 potential is charged by the charge capacitance C1 in the X1 period and becomes an increased potential Vcc+Vcc=2Vcc. For this reason, the t2 and t3, in which the gate of each nMOS is coupled to the n1 potential, are turned ON and the gate potential n3 of the transfer nMOS and the substrate potential n2 become the Vcc and the T1 is turned OFF.

At the second stage, since CLKn=0 V and 2VCLK=2Vcc and the n4 potential is equal to or lower than the 2Vcc, the n1 potential≧the n4 potential and the t4 in which the gate of the nMOS is coupled to the n1 potential is turned ON and the t5 in which the n4 potential is coupled to the gate of the nMOS is turned OFF. For this reason, a substrate potential n5 of the transfer MOS T2 becomes the n4 potential. Also, when the t6 in which the n3 potential equal to the Vcc is coupled to the gate of the nMOS is turned OFF, the n6 potential becomes 3Vcc obtained by adding 2VCLK=2Vcc to a potential having been made the Vcc in the X1 period and the T2 is turned ON. Due to this, the electric charges are moved from the charge capacitances C1 to C2, and eventually the n4 potential becomes the 2Vcc.

The odd-numbered (2N−1)-th stage (N is equal to or larger than 1) including the third and later stages is such that, similarly to the first stage, the TMOS is turned OFF and the connection point between the charge capacitance C(2N−1) and the TMOS becomes at a Vcc+Vcc×(2N−1). Also, the even-numbered 2N-th stage is such that the TMOS is turned ON and the connection point between the charge capacitance C(2N) and the TMOS becomes at a Vcc×2N.

Figure 9:
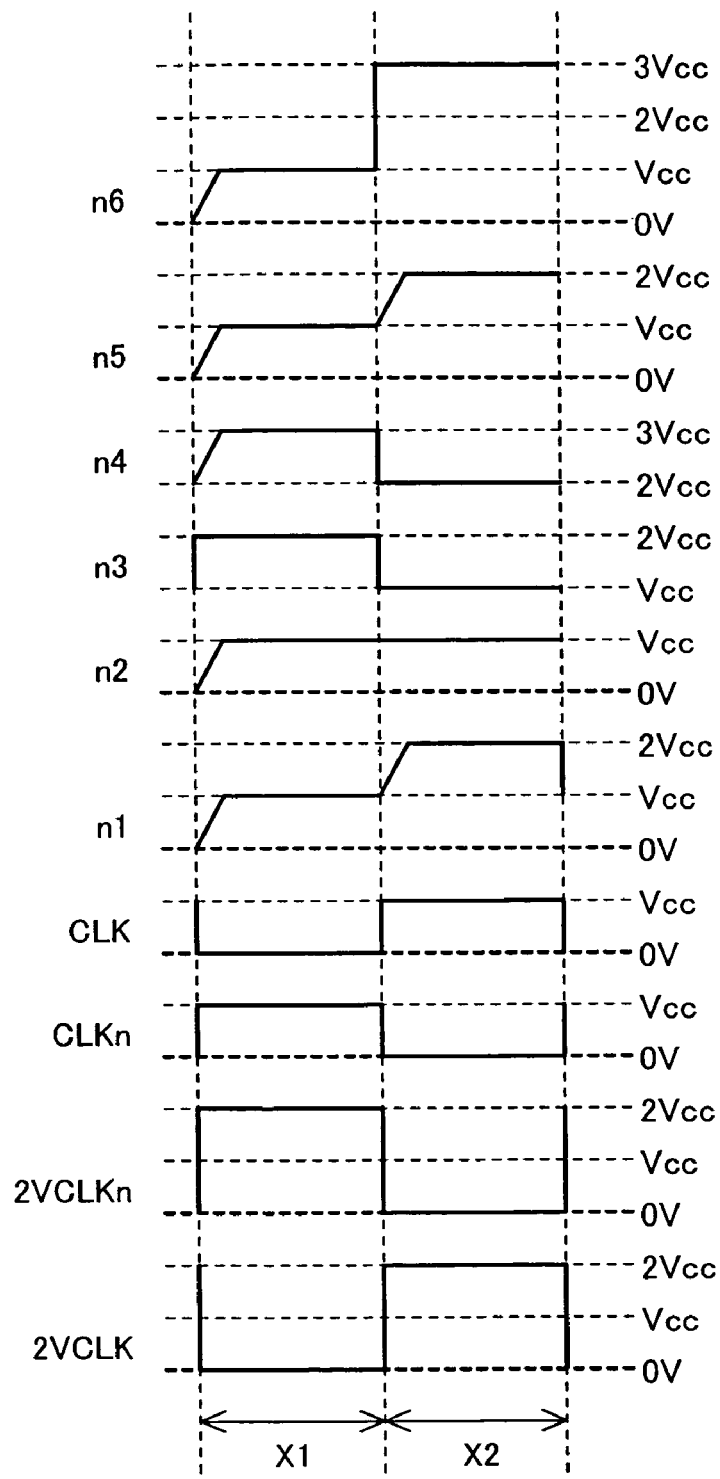
FIG. 9 is a timing chart of the charge pump circuit according to the first embodiment of the present invention.

FIG. 9 shows voltage states in the circuit in the CLK X1 and X2 periods. Here, a gate of a gate voltage set MOS of a TMOS at an N-th stage is connected to a gate of a TMOS at an (N−1)-th stage, but the gate of the gate voltage set MOS of the TMOS at the first stage is coupled to and controls the n1 potential to which the charge pump capacitance C1 is connected.

In this charge pump, if a voltage amplification factor per stage is a Vga in the case of boosting the plus voltage, a voltage Vout outputted from this charge pump can be represented by the following Equation (4).

$$Vout = Vga \times N + Vcc \qquad (4)$$

N: number of stages and Vcc: power-supply voltage, wherein the voltage amplification factor Vga becomes the maximum Vcc. When a load current IL flows through the Vout, $$\Delta V = (IL \times t)/C \qquad (5)$$

C: charge pump capacitance and t: CLK cycle time.

Since a voltage drop of "ΔV" represented by Equation (5) occurs, $$Vga = Vcc - \Delta V \qquad (6)$$

The Vga is represented as shown in Equation (6).

Here, when the load current IL flows, potentials at the respective connection points shown in FIGS. 7 and 8 are such that: the connection points shown in FIG. 7 have n1=n2=n5=n6=~(Vcc−ΔV), n3=2Vcc, and n4=3Vcc−2ΔV; the connection points shown in FIG. 8 have n1=2Vcc−ΔV, n2=n3=Vcc, n4=n5=2Vcc−2ΔV, and n6=3Vcc−ΔV; and a voltage drop of (number of stages×ΔV) occurs at the connection points n1 and n4 between the charge capacitance and the TMOS at each stage.

Figure 10:
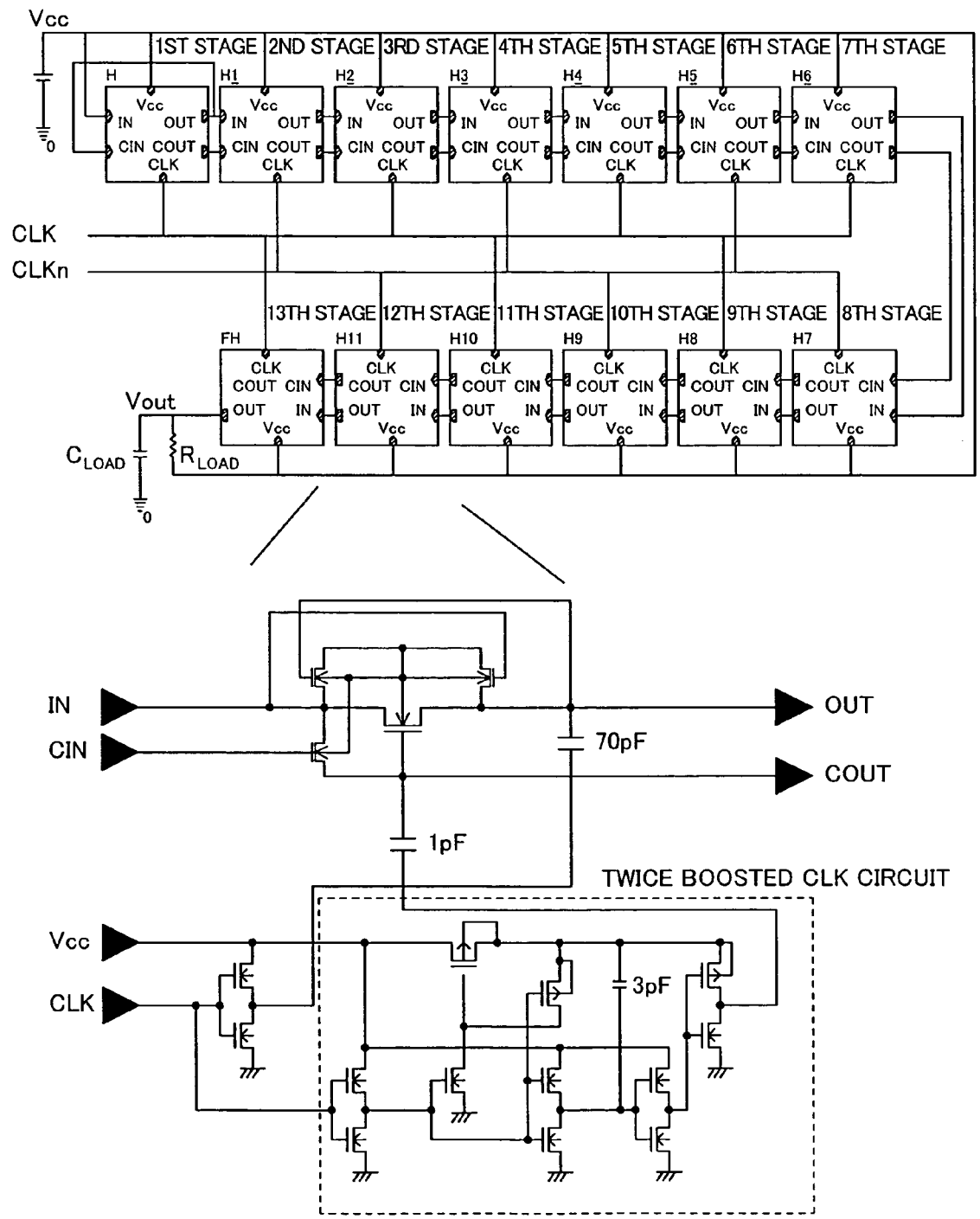
FIG. 10 is a simulated circuit diagram of the charge pump circuit according to the first embodiment of the present invention.
Figure 11:
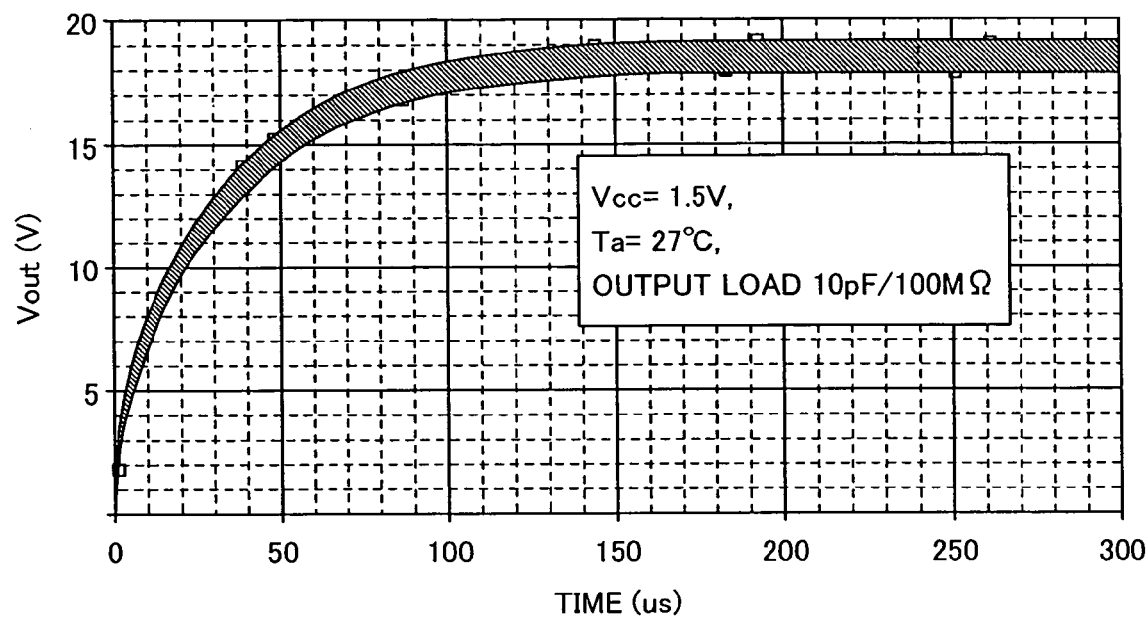
FIG. 11 is a graph representing simulation results of the charge pump circuit according to the present invention.
Figure 11:
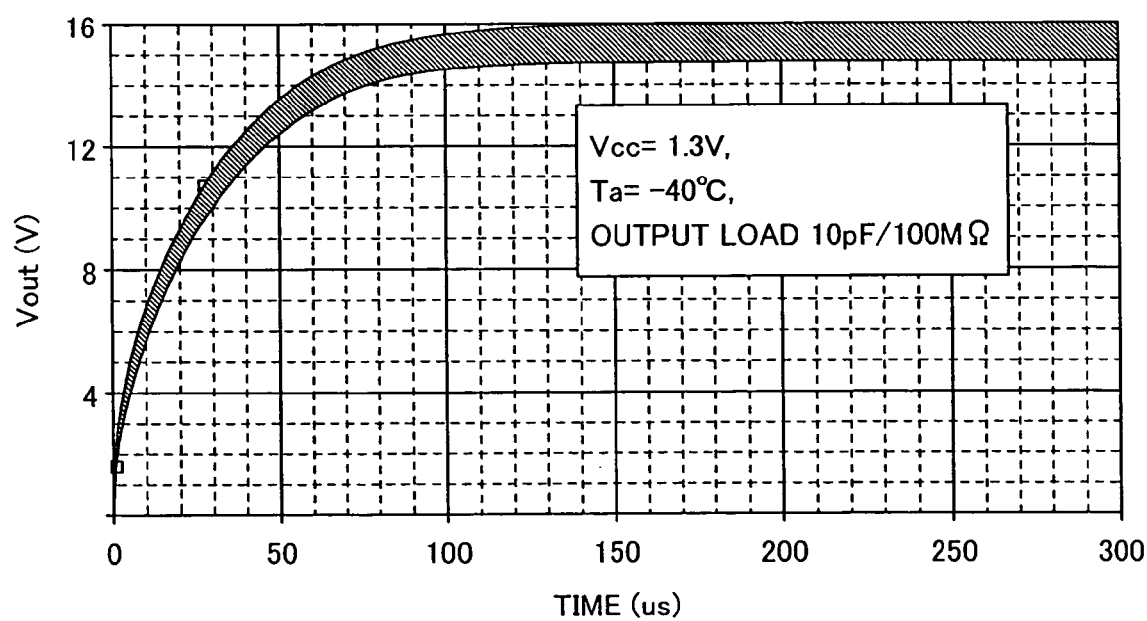

FIG. 10 shows a simulated circuit of the body controlled charge pump circuit according to the present invention and FIG. 11 shows Spice simulation results. In a circuit configuration where the number of charge pump stages is 13 and the charge pump capacitance is 70F/stage, on the conditions that load resistance (RLOAD)=100 MΩ and load capacitance (CLOAD)=100 pF, approximately 18.5 V is achieved when the power-supply voltage Vcc=1.5 V and approximately 15.5 V is achieved when the power-supply voltage Vcc=1.3 V. Therefore, a high voltage equal to or higher than approximately 12 V required for deleting and writing the non-volatile memory can be generated even at a low power-supply voltage. At the time of this Spice simulation, the Vt0 of the transfer MOS is approximately 0.9 V and the substrate effect coefficient γ is approximately 0.8.

Figure 12:
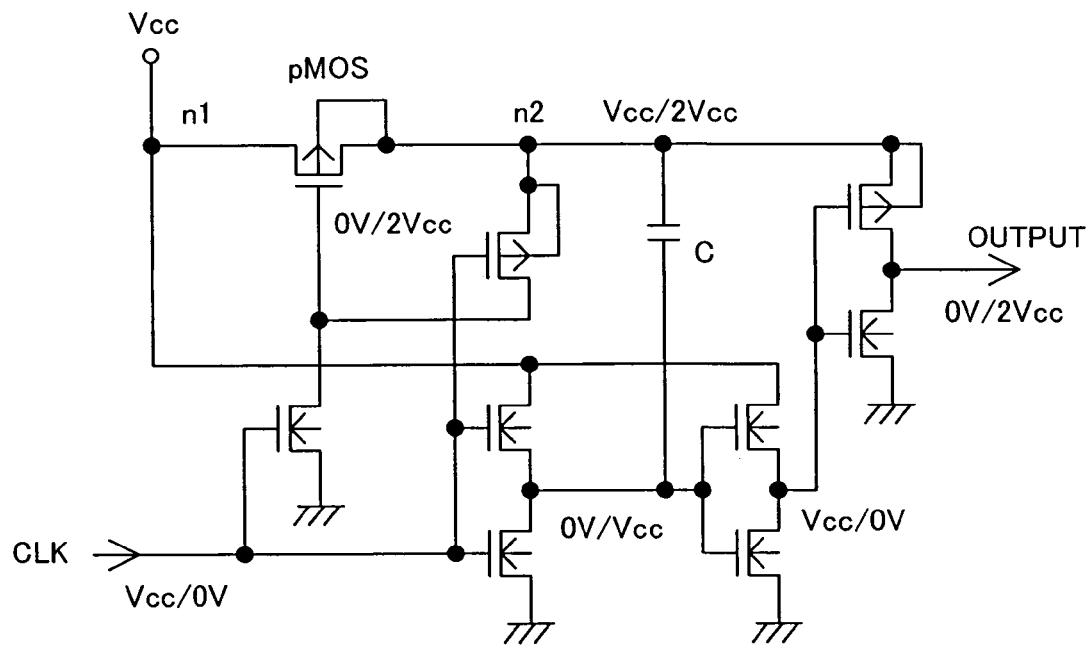
FIG. 12 is a twice boosted CLK circuit.

Here, with reference to FIG. 12, an operation of a twice boosted CLK circuit shown also in FIG. 10 will be described. The twice boosted CLK circuit is a circuit for generating the 2VCLK and 2VCLKn from the CLK and CLKn as shown in FIGS. 5 to 8. Also in this twice boosted CLK circuit, a charge pump scheme is used, and a pMOS is used as the transfer MOS. When CLK=Vcc, a gate of a transfer pMOS become at 0 V and electric charges are charged into the capacitance C. The n2 potential becomes the Vcc and, at the same time, the output thereof becomes 0 V. Next, when CLK=0 V, the n2 potential becomes 2×Vcc and the gate of the transfer pMOS is set to the n2 potential, whereby the transfer pMOS is turned OFF. Also, an output thereof becomes 2×Vcc since the n2 potential is outputted. Thus, the twice boosted CLK circuit generates a voltage within a range of 0 V to 2Vcc in synchronization with the inputted CLK.

Figure 13:
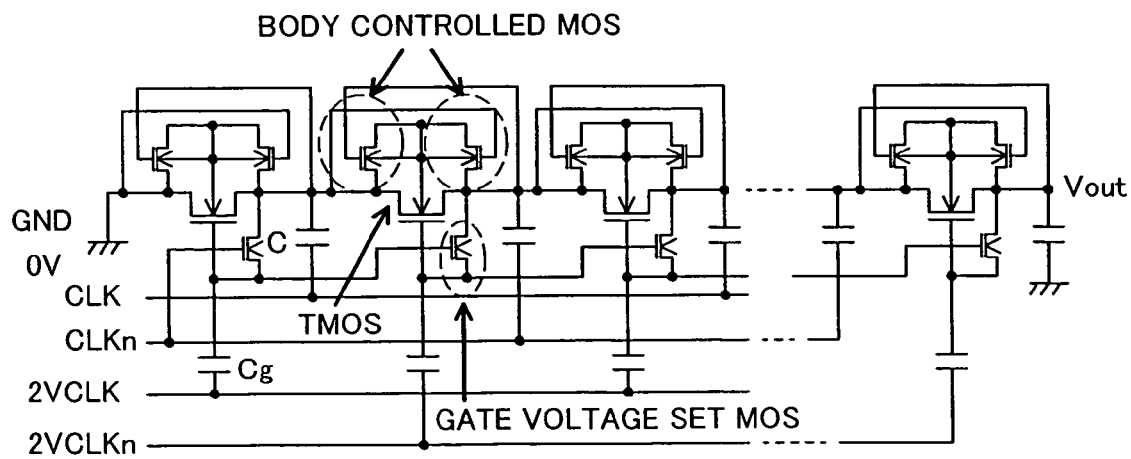
FIG. 13 is a diagram of a minus-high-voltage generating charge pump circuit according to a second embodiment of the present invention.

Although FIGS. 5 to 12 relate to the charge pump generating a plus high voltage, FIG. 13 shows a circuit for generating a minus high voltage according to a second embodiment of the present invention.

Although the circuit configuration is almost the same as that in FIG. 5, a phase of the CLK and a position of the gate voltage set MOS are different. The drain and source of the gate voltage set MOS are connected to an opposite side of the connection point between the TMOS and the charge capacitance C and to the gate of the TMOS in the case of the plus boosting shown in FIG. 5 while being connected to the connection point between the TMOS and the charge capacitance C and to the gate of the TMOS in the case of the minus boosting shown in FIG. 13. Also, in the case of the plus boosting shown in FIG. 5, the CLK and 2VCLKn and the CLKn and 2VCLK become pairs, whereby each pump cell has been controlled. However, in the case of the minus boosting shown in FIG. 13, the CLK and 2VCLK and the CLKn and 2VCLKn become pairs, whereby each pump cell is controlled. For this reason, in the case of the plus boosting, the plus high voltage is obtained by making the electric charges flow in a charge capacitance at the next stage. However, a direction of flow of the electric charges in the case of the minus one is made reverse to that in the case of the plus, so that the electric charges are made to flow in the preceding stage, whereby the minus high voltage is obtained.

Furthermore, the gate of the gate voltage set MOS of a TMOS at an N-th stage is connected to a gate of a TMOS at an (N−1)-th stage, and the gate of the gate voltage set MOS of the TMOS at the first stage is coupled to and controls the CLKn. The substrate of the gate voltage set MOS of the TMOS at each stage is coupled to the substrate potential of the transfer MOS at each stage.

Figure 14:
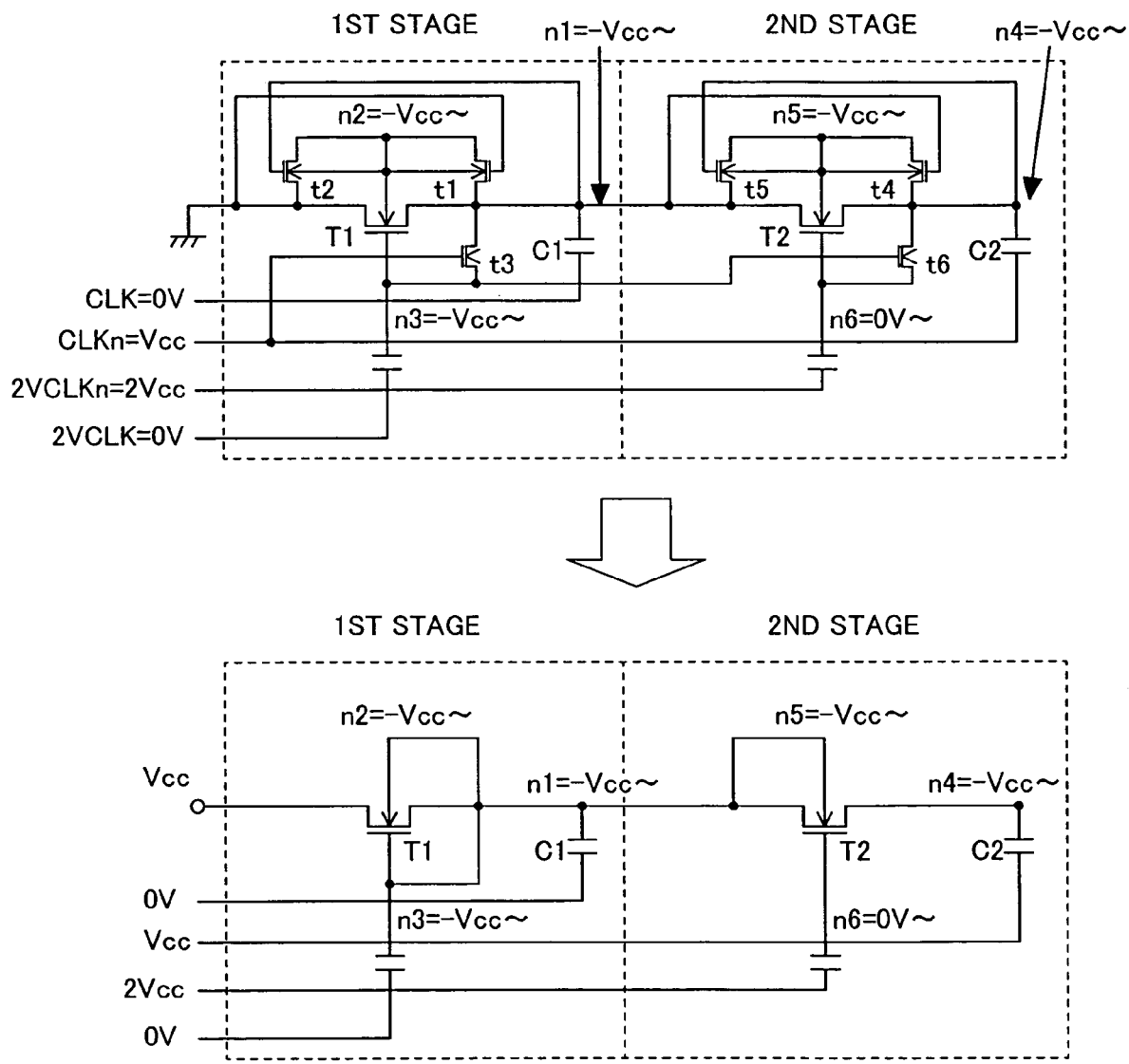
FIG. 14 is a circuit's explanatory diagram of the charge pump circuit according to the second embodiment of the present invention in the period of CLK X1.

An operation thereof will be described by using FIGS. 14 and 15. In a period of CLK X1 shown in FIG. 14, CLK=0 V and 2VCLK=0 V, and the n3 potential of the gate of the transfer MOS at the first stage is such that since the gate of the gate voltage set MOS is coupled to CLKn=Vcc, the gate voltage set MOS is turned ON and the n3 potential and the n1 potential are coupled to each other. During the operation, the n1 potential is within a range of −Vcc to 0 V, so that the T1 is turned OFF. Also, the substrate potential n2 of the T1 is such that the t2 is turned OFF and the t1 is turned ON and the n2 potential and the n1 potential are coupled to each other.

At the second stage, CLKn=Vcc and 2VCLKn=2Vcc, and an n6 potential of the gate of the T2 is within a range of approximately −2Vcc to approximately 0 V due to the 2VCLK. Also, the n3, which is a gate potential of the t6, is such that since the t6 is turned OFF at approximately −Vcc, the T2 is turned ON and the n4 potential becomes −Vcc equal to the n1 potential. Also, the n5 potential is such that since the n4 potential is higher than the n1 potential by approximately Vcc immediately after the CLK becomes the Vcc, the t5 is turned ON and the n5 potential becomes identical to the n1 potential.

Figure 15:
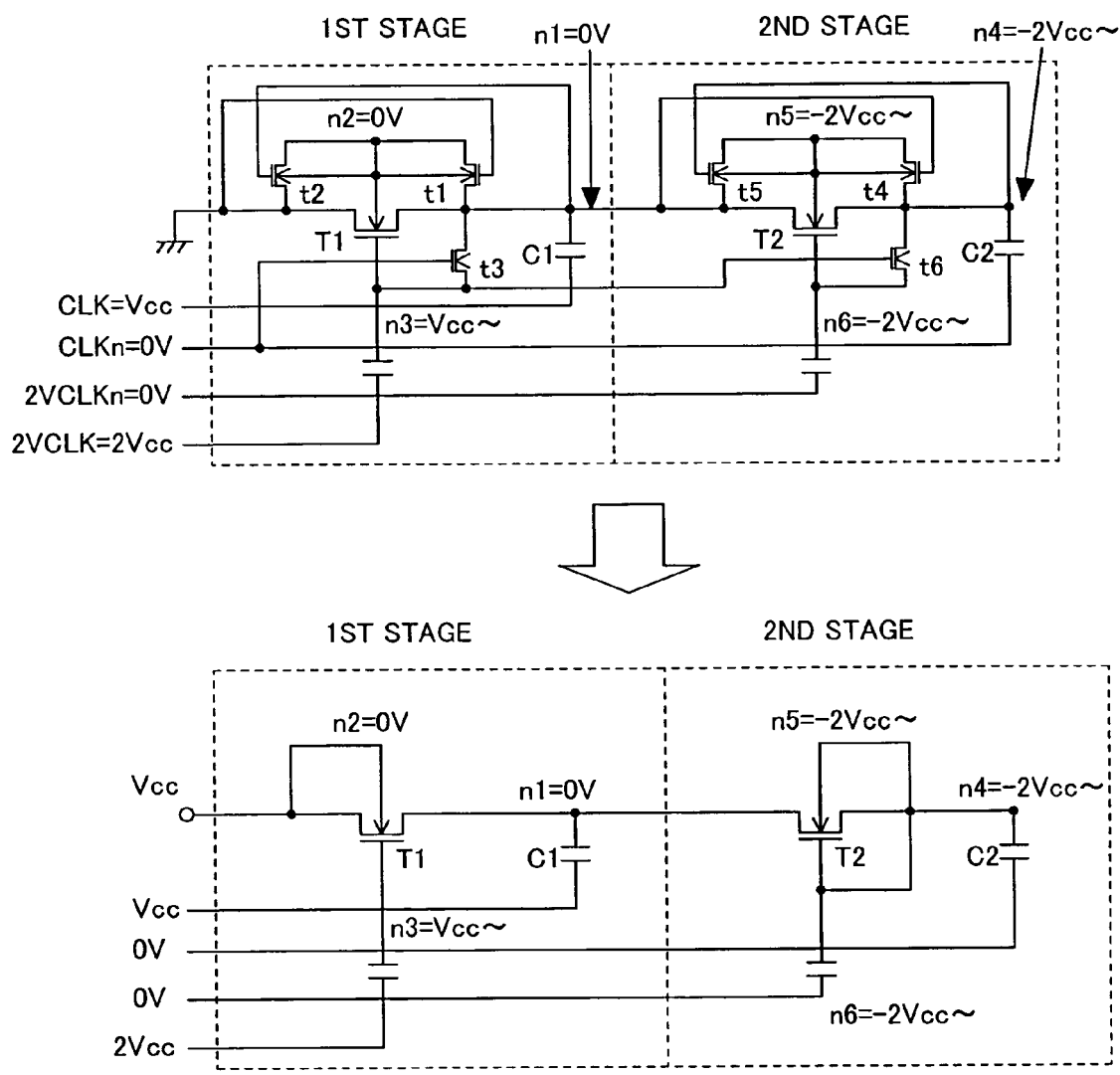
FIG. 15 is a circuit's explanatory diagram of the charge pump circuit according to the second embodiment of the present invention in the period of CLK X2.

In a period X2 shown in FIG. 15, CLK=Vcc and 2VCLK =2Vcc and the n3 potential is changed from −Vcc to Vcc due to the 2VCLK. Also, the t3 is turned OFF due to CLKn=0 V, so that the T1 is turned ON and the n1 potential becomes 0 V. Furthermore, the n2 potential is such that since the n1 potential is higher than the n1 potential by approximately Vcc immediately after the CLK becomes the Vcc, the t2 is turned ON and the n2 potential becomes 0 V.

At the second stage, CLKn=0 V and 2VCLKn=0 V, and the n6 potential of the gate of the T2 becomes within a range of approximately 0 V to approximately −2Vcc due to the 2VCLK. Also, the n4 potential is changed from −Vcc to −2Vcc due to the CLKn and "the gate potential n3 of t6"=Vcc, so that the t6 is turned ON and the n6 potential and the n4 potential are coupled to each other and the T2 is turned OFF. Further, since the t4 is turned ON, the n5 potential becomes −2Vcc equal to the n4 potential.

Here, in the case of the minus voltage boosting, if a voltage amplification factor per stage is Vga, the voltage Vout outputted from this charge pump can be represented by the following Equation (7):

$$Vout = Vga \times N \quad (7)$$

N: number of stages and Vcc: power-supply voltage.

The voltage amplification factor Vga becomes the Vcc at maximum.

FIGS. 5 to 15 relate to the charge pump circuit in which the transfer MOS, the body controlled MOSs, and the gate voltage set MOS are configured by the nMOSs. However, a third embodiment, which is configured by pMOSs and is a charge pump circuit according to the present invention, is shown in FIG. 16 and a fourth embodiment thereof is shown in FIG. 17.

Figure 16:
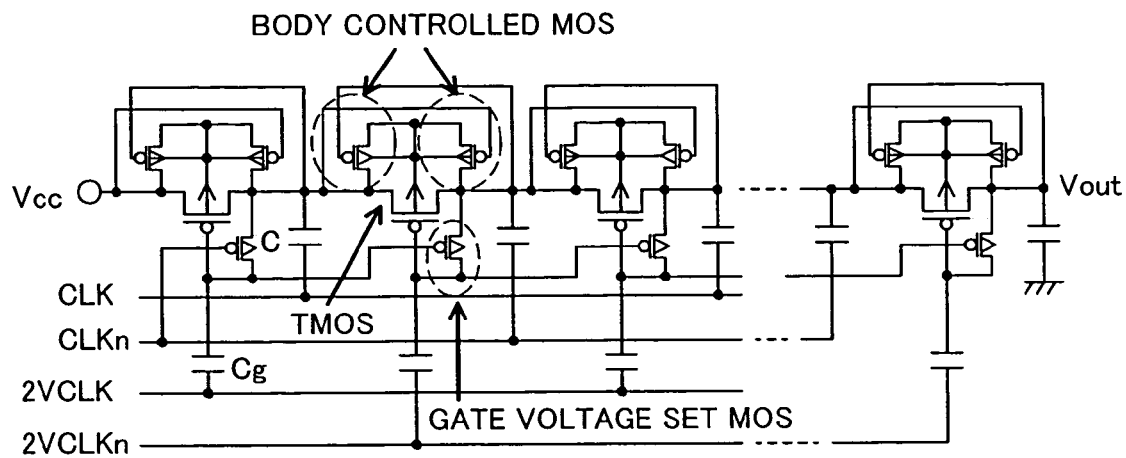
FIG. 16 is a diagram of a plus-high-voltage generating charge pump circuit showing a third embodiment of the present invention.

FIG. 16 is a plus boosting change pump circuit in which pMOSs are used for the TMOS, body controlled MOSs, and gate voltage set MOS. Also, the CLK and 2VCLK and the CLKn and 2VCLKn, which have the same clocks in phase, become pairs and control each pump cell, so that the electric charges are transferred from the pump cell at the previous stage to the relevant pump cell and the plus boosting is further executed in accordance with progress to the subsequent stages. Also, unlike the case of the nMOS, the substrate of the transfer MOS is set by the body controlled MOS to the drain or source potential of the transfer, whichever is higher in potential.

Figure 17:
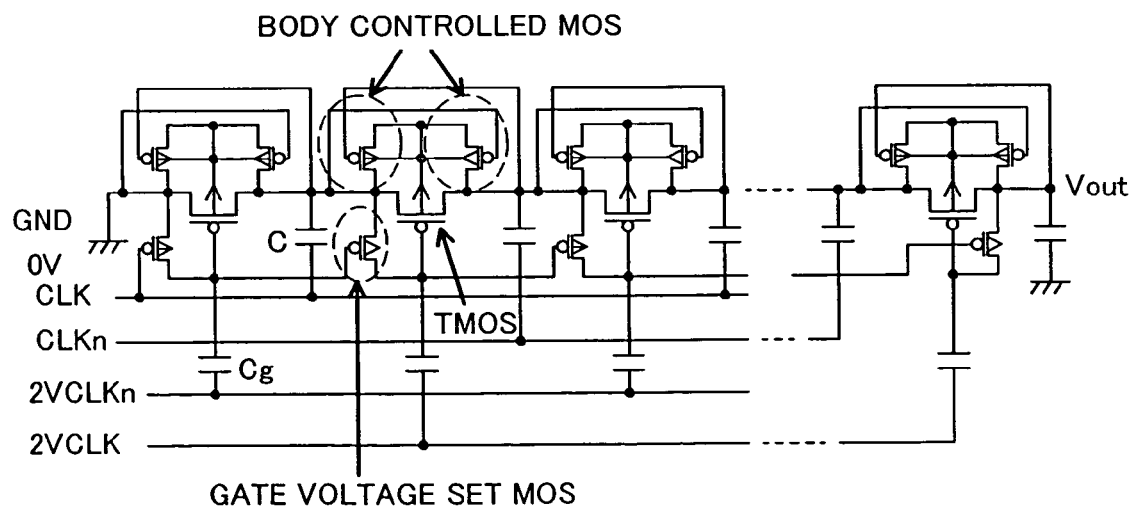
FIG. 17 is a diagram of a minus-high-voltage generating charge pump circuit showing a fourth embodiment of the present invention.

FIG. 17 is a minus boosting charge pump circuit. Unlike the case of the plus boosting shown in FIG. 16, the gate voltage set MOS is disposed on a side opposite to the charge capacitance, and the CLK and 2VCLKn and the CLKn and 2VCLK, which have clocks reversed in phase, become pairs and control each pump cell. For this reason, the electric charges are transferred from the relevant pump cell to the pump cell at the preceding stage, and the minus boosting is further executed in accordance with progress to the subsequent stages. Also, similarly to the plus boosting shown in FIG. 16, the substrate of the transfer MOS is set by the body controlled MOS to the drain or source potential of the transfer, whichever is higher in potential. As seen also from FIGS. 16 and 17, the circuit configuration is identical to that in the case of use of the nMOSs. The plus booster circuit using the pMOSs shown in FIG. 16 has the same circuit configuration as that of the minus booster circuit using the nMOSs shown in FIGS. 14 and 15, and the minus booster circuit using the pMOSs shown in FIG. 17 has the same circuit configuration as that of the plus booster circuit using the nMOSs shown in FIGS. 5 to 8, so that even if either of the pMOS and nMOS is used, the plus and minus boosted voltages can be obtained by the same circuit configuration.

Figure 18:
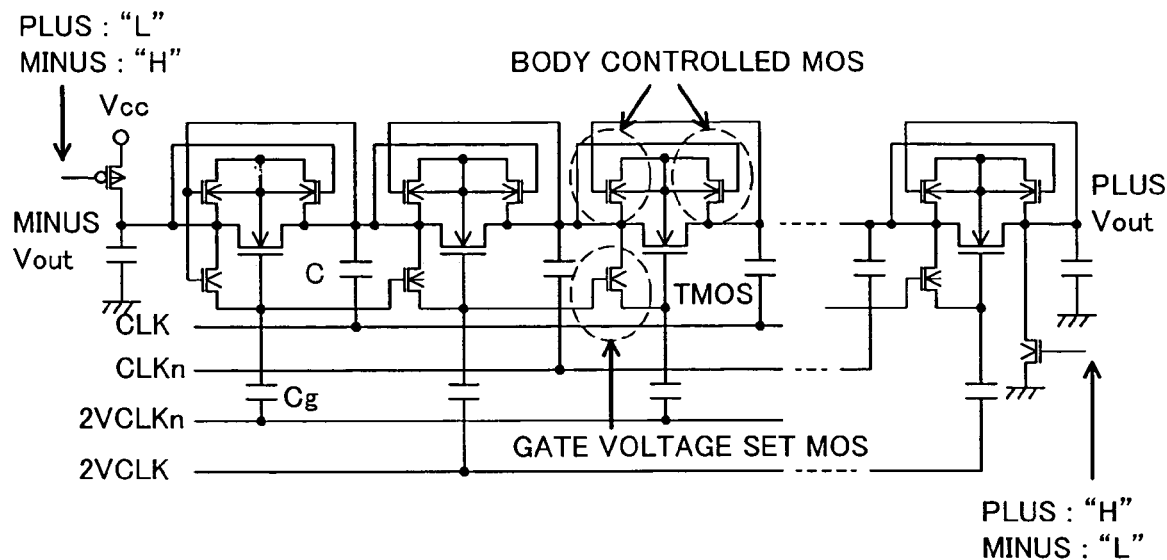
FIG. 18 is a diagram of a plus-and-minus high-voltage generating charge pump circuit showing a fifth embodiment of the present invention.

In controlling the non-volatile memory, for example in some cases, a minus high voltage may be required at deletion and a plus high voltage may be required at writing. In this case, separate manufacture of plus and minus charge pump circuits causes an increase in chip areas, whereby chip prices rise. Therefore, based on the fact that deletion and writing do not occur simultaneously, a charge pump circuit, which generates a plus or minus high voltage by using a single one and is a fifth embodiment of the present invention, is suggested by FIG. 18. Although the basic circuits thereof are the same as that in FIG. 5 and the basic operation thereof is also the same as that described with reference to FIGS. 7 and 8, this embodiment has a feature in which the input and output can be reversed by a selection circuit and a selection signal at a time of occurrence of a plus high voltage or at a time of occurrence of a minus high voltage. The operation at the occurrence of the plus high voltage is the same as that described with reference to FIGS. 5 to 8, wherein the input is set to a Vdd on the left side in FIG. 18 and the output is set on the right side in FIG. 18. At the occurrence of the minus high voltage, the input is set to 0 V on the right side in FIG. 18 and the output is set on the left side in FIG. 18. The movement of the electric charges at the occurrence of the plus and minus high voltages is changed from left to right in FIG. 18. Therefore, in the case of the minus one, the electric charges flow into 0 V and accordingly the previous stage becomes gradually negatively charged, whereby the minus high voltage can be generated.

Figure 19:
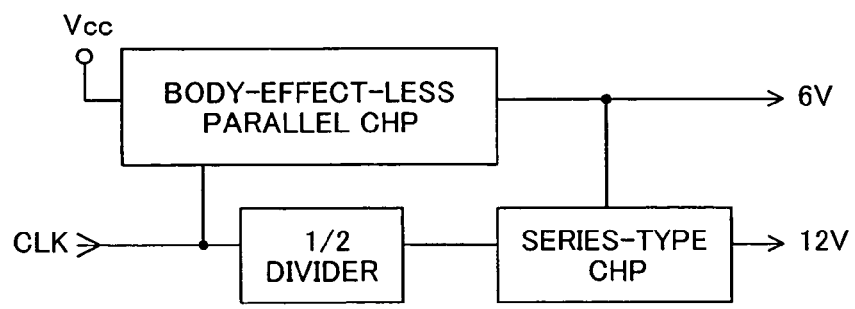
FIG. 19 is a diagram of a high-voltage generating charge pump circuit showing a sixth embodiment of the present invention.
Figure 20:
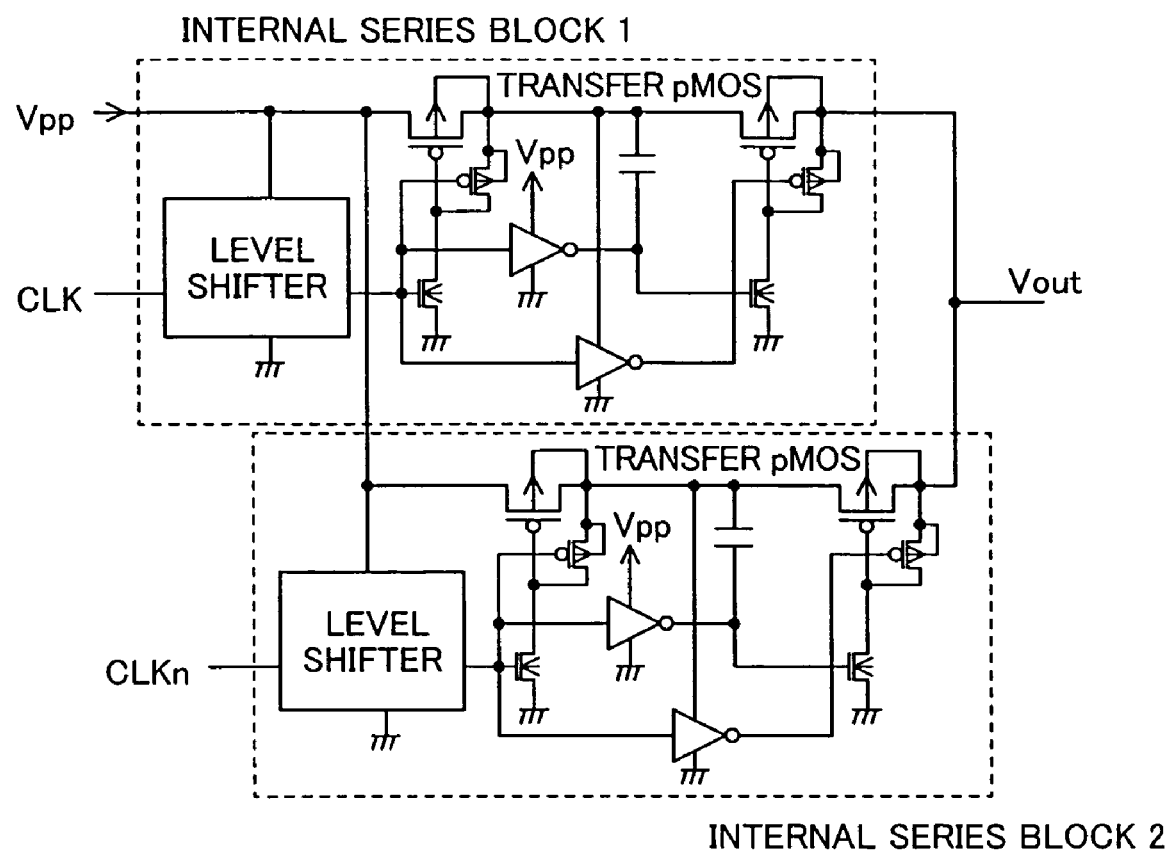
FIG. 20 is a serial-type charge pump circuit showing a seventh embodiment of the present invention.

Next, in controlling the non-volatile memory, for example in some cases, two types of high voltages, such as 12 V and 6 V, may be simultaneously required. A sixth embodiment according to the present invention, which is a circuit configuration for generating a first high voltage outputted from the charge pump circuit shown in FIG. 5 and generating a second high voltage by using this first high voltage, is shown in FIG. 19. A body controlled parallel-type charge pump shown in FIG. 19 is identical to that shown in FIG. 5. A serial-type charge pump of FIG. 19, which is a seventh embodiment of the present invention, is shown in FIG. 20. The serial-type charge pump has a feature in which: a potential twice as much as the first high voltage can be obtained by using the transfer pMOS and turning ON or OFF the charge capacitance at the first high voltage; and an internal series block 1 and an internal series block 2 are alternately turned ON and OFF by using a CLK signal of the serial-type charge pump.

Figure 21:
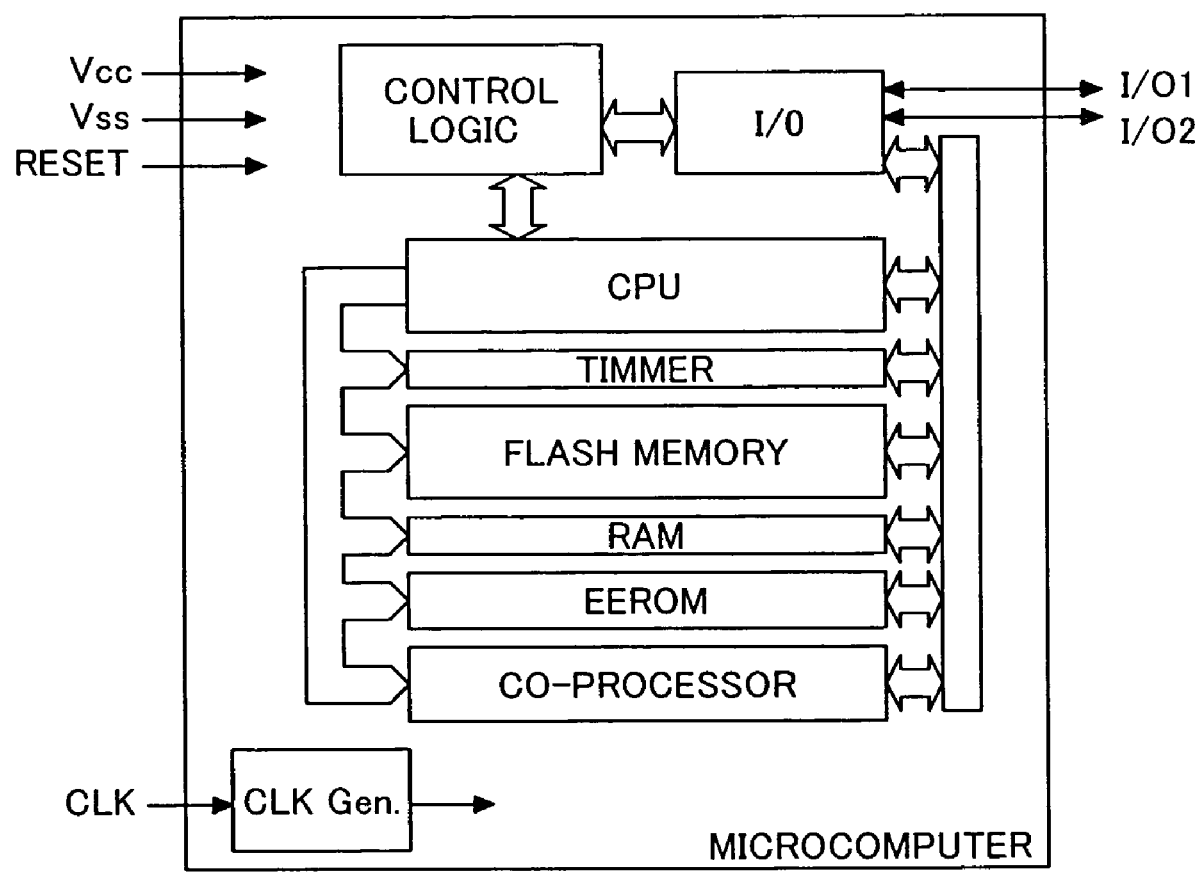
FIG. 21 is a hardware structure of an IC card on which the charge pump circuit according to the present invention is mounted.

FIG. 21 shows a hardware configuration of an IC card on which the booster circuit according to the present invention is mounted. The booster circuit according to the present invention is mounted on a flash memory and a EEPROM in IC card hardware.

Also, since the flash memory and the EEPROM require plus or minus high voltages at the time of writing or deleting data, the booster circuit according to the present invention is used. However, the booster circuit according to the present invention can be used at the reading to check whether a memory subjected to writing and deletion reaches an expected threshold.

In the following, the charge pump circuit described in the above embodiments can be applied to, for example, an LSI circuit, an IC card chip, and an IC card including a non-volatile memory typified by an EEPROM and a flash memory, which requires a plus or minus high voltage other than a power-supply voltage.

INDUSTRIAL APPLICABILITY

The present invention is used in a non-volatile memory, an IC chip requiring a voltage equal to or higher than a power-supply voltage, or the like.

The invention claimed is:

1. A booster circuit connecting and boosting basic charge pump cells disposed respectively at N stages, the booster circuit comprising:
said basic charge pump cells each including at least a first MISFET, a second MISFET, a third MISFET, and a first capacitor, a fourth MISFET, and a second capacitor,
wherein a back gate of said first MISFET is connected to a first node, and a source-drain path thereof is connected between a second node and a third node,
a back gate of said second MISFET is connected to said first node, and a source-drain path thereof is connected between said first node and said second node,
a back gate of said third MISFET is connected to said first node, and a source-drain path thereof is connected between said first node and said third node,
one end of said first capacitor is connected to said third node, and a first clock with an amplitude of an operating voltage is inputted to the other end thereof,
said third node is connected to a second node of said basic charge pump cell at a next stage,
one end of said second capacitor is connected to a gate of said first MISFET, and a second clock, having a voltage amplitude larger than that of a sum of said operating voltage and a threshold voltage of said first MISFET and being a reversed phase to said first clock, is inputted to the other end thereof, and
a back gate of said fourth MISFET is connected to said first node, a source-drain path thereof is connected between said second node and the gate of said first MISFET, and, for each of the N stages other than a first stage, a gate thereof is connected said one end of said second capacitor configuring said basic charge pump cell at a preceding stage.

2. The booster circuit according to claim 1,
wherein said first, second, third, fourth MISFETs are n-type MISFETs, and
a voltage is boosted on a positive side.

3. The booster circuit according to claim 1,
wherein said first, second, third, and fourth MISFETs are p-type MISFETs, and
a voltage is boosted on a negative side.

4. The booster circuit according to claim 1, further comprising:
a twice boosted clock generating circuit for generating a clock of a voltage twice as much as said operating voltage, and
wherein said twice boosted clock generating circuit generates said second clock.

5. The booster circuit according to claim 1, further comprising:
a selection circuit for choosing which of plus or minus voltages is boosted.

6. The booster circuit according to claim 5,
Wherein said selection circuit is a circuit for connecting a second node of one of said basic charge pump cell at a first stage and said basic charge pump cell at a last stage to said operating voltage, and for connecting a third node of the other thereof to a ground potential.

7. The booster circuit according to claim 1, further comprising:
a serial-type charge pump,
wherein said serial-type charge pump outputs a second voltage from a first voltage outputted from said booster circuit.

8. A non-volatile memory executing at least one of reading, writing, and deletion in accordance with a voltage generated by the booster circuit according to claim 1.

9. An IC card having the non-volatile memory according to claim 8.

10. A booster circuit connecting and boosting basic charge pump cells disposed respectively at N stages, the booster circuit comprising:
said basic charge pump cells each including at least a first MISFET, a second MISFET, a third MISFET, a first capacitor, a fourth MISFET, and a second capacitor,
wherein a back gate of said first MISFET is connected to a first node, and a source-drain path thereof is connected between a second node and a third node,
a back gate of said second MISFET is connected to said first node, and a source-drain path thereof is connected between said first node and said second node,
a back gate of said third MISFET is connected to said first node, and a source-drain path thereof is connected between said first node and said third node,
one end of said first capacitor is connected to said third node, and a first clock with an amplitude of an operating voltage is inputted to the other end thereof,
said third node is connected to a second node of said basic charge pump cell at a next stage,
one end of said second capacitor is connected to a gate of said first MISFET, and a second clock, having a voltage amplitude larger than that of a sum of said operating voltage and a threshold voltage of said first MISFET and having a same phase as said first clock, is inputted to the other end thereof, and a source-drain path of said fourth MISFET is connected between said third node and the gate of said first MISFET, and, for each of the N stages other than a first stage, a gate thereof is connected said one end of said second capacitor configuring said basic charge pump cell at a preceding stage.

11. The booster circuit according to claim 10, wherein said first, second, third, and fourth MISFETs are n-type MISFETs, and a voltage is boosted on a negative side.

12. The booster circuit according to claim 10, wherein said first, second, third, and fourth MISFETs are p-type MISFETs, and a voltage is boosted on a positive side.

13. The booster circuit according to claim 10, wherein said first clock inputted to said basic charge pump cells at odd-numbered stages and said first clock inputted to said basic charge pump cells at even-numbered stages are opposite in phase, and said second clock inputted to said basic charge pump cells at the odd-numbered stages and said second clock inputted to said basic charge pump cells at the even-numbered stages are opposite in phase.

14. A booster circuit connecting and boosting basic charge pump cells disposed respectively at N stages, the booster circuit comprising:

said basic charge pump cells each including:

an n-type transfer MISFET, and a first connection circuit for connecting a drain or source of said transfer MISFET, whichever is lower in potential, and a back gate of said transfer MISFET;

a circuit applying, to a gate of said transfer MISFET via a capacitance, a voltage having a voltage amplitude larger than that of a sum of an operating voltage and a threshold voltage of said transfer MISFET; and a second connection circuit for connecting the gate of said transfer MISFET and one of the drain and source thereof when said transfer MISFET is in an OFF state.

15. The booster circuit according to claim 14, wherein said first connection circuit is configured by a first body controlled MISFET and a second body controlled MISFET, and one of said first and second body controlled MISFETs is conducted, and the drain or source of said transfer MISFET, whichever is lower in potential, and the back gate of said transfer MISFET are connected.

16. The booster circuit according to claim 14, wherein said second connection circuit is a gate voltage set MISFET, whose drain-source path is connected between the gate and the drain or source of said transfer MISFET, and, for each of the N stages other than a first stage, in which a gate voltage of said transfer MISFET in the pump cell at a preceding stage is applied to a gate value thereof.

17. A booster circuit connecting and boosting basic charge pump cells disposed respectively at N stages, the booster circuit comprising:

said basic charge pump cells each including:

a p-type transfer MISFET;

a first connection circuit for connecting a drain or source of said transfer MISFET, whichever is lower in potential, and a back gate of said transfer MISFET;

a circuit applying, to a gate of said transfer MISFET via a capacitance, a voltage having a voltage amplitude larger than that of a sum of an operating voltage and a threshold voltage of said transfer MISFET; and a second connection circuit for connecting the gate of said transfer MISFET to one of the drain and source thereof when said transfer MISFET is in an OFF state.

18. The booster circuit according to claim 17, wherein said first connection circuit is configured by a first body controlled MISFET and a second body controlled MISFET, and one of said first and second body controlled MISFETs is conducted, and the drain or source of said transfer MISFET, whichever is lower in potential, and the back gate of said transfer MISFET are connected.

19. The booster circuit according to claim 17, wherein said second connection circuit is a gate voltage set MISFET, whose drain-source path is connected between the gate and the drain or source of said transfer MISFET, and, for each of the N stages other than a first stage, in which a gate voltage of said transfer MISFET in the pump cell at a preceding stage is applied to a gate value thereof.

* * * * *